United States Patent
Ishige

(10) Patent No.: US 6,503,797 B2
(45) Date of Patent: Jan. 7, 2003

(54) NONVOLATILE SEMICONDUCTOR STORAGE APPARATUS AND PRODUCTION METHOD OF THE SAME

(75) Inventor: Kiyokazu Ishige, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/930,950

(22) Filed: Aug. 17, 2001

(65) Prior Publication Data
US 2001/0055847 A1 Dec. 27, 2001

Related U.S. Application Data

(62) Division of application No. 09/154,982, filed on Sep. 17, 1998, now Pat. No. 6,392,268.

(30) Foreign Application Priority Data

Sep. 19, 1997 (JP) .............................................. 9-255697

(51) Int. Cl.$^7$ ............................................ H01L 21/336
(52) U.S. Cl. ...................... 438/257; 438/211; 438/264; 438/593; 438/594; 257/314; 257/315; 257/316
(58) Field of Search ................................ 438/257, 264, 438/594, 211, 593; 257/355, 356, 316, 315

(56) References Cited

U.S. PATENT DOCUMENTS

| | | | |
|---|---|---|---|
| 5,424,233 A | 6/1995 | Yang et al. | |
| 5,457,652 A | 10/1995 | Brahmbhatt | 365/185.06 |
| 5,760,445 A * | 6/1998 | Diaz | 257/356 |
| 5,892,258 A | 4/1999 | Kobatake | 257/316 |
| 5,903,031 A | 5/1999 | Yamada et al. | 257/356 |
| 5,932,916 A | 8/1999 | Jung | 257/355 |
| 5,998,826 A | 12/1999 | Hung et al. | 257/315 |
| 6,060,742 A | 5/2000 | Chi et al. | 257/316 |
| 6,090,667 A * | 7/2000 | Hara | 438/258 |

FOREIGN PATENT DOCUMENTS

| | | | |
|---|---|---|---|
| EP | 0 379 024 | 7/1990 | |
| JP | 2-297960 | * 12/1990 | H01L/27/088 |
| JP | 5-55606 | 3/1993 | |
| JP | 7-45729 | 2/1995 | |
| JP | 407244991 A | * 9/1995 | H01L/27/115 |
| JP | H08-181284 | 7/1996 | |
| JP | 9-74200 | 3/1997 | |
| JP | 10-200077 | 7/1998 | |

OTHER PUBLICATIONS

Patent Abstracts of Japan, vol. 6, No. 185 (E–132). Sep. 21, 1982.
Patent Abstracts of Japan, vol. 199, No. 707, Jul. 31, 1997.

* cited by examiner

Primary Examiner—Matthew Smith
Assistant Examiner—B V Keshavan
(74) Attorney, Agent, or Firm—Sughrue Mion, PLLC

(57) ABSTRACT

The present invention prevents a charge-up during a wiring layer etching in a nonvolatile semiconductor storage apparatus, having a floating gate and a control gate to which both of positive and negative voltages are applied during a memory cell operation, by providing a current path from the control gate to a substrate via a charge-up preventing element. A first well is formed in the substrate. A second well is formed in the first well. The charge-up preventing element is formed in the second well. The substrate and second well are of one conductive type (p or n) and the first well and charge-up preventing element are of the other conductive type. Before memory cell operation, the control gate is disconnected from the charge-up preventing element.

14 Claims, 9 Drawing Sheets

CHARGE-UP DURING WIRING LAYER ETCHING (⊖)

NONVOLATILE SEMICONDUCTOR STORAGE APPARATUS AND PRODUCTION METHOD OF THE SAME

This is a divisional of application Ser. No. 09/154,982 filed Sep. 17, 1998, now U.S. Pat. No. 6,392,268, the disclosure of which is incorporated herein by reference.

BACKGROUND OF THE INVENTION

1. Field of the Invention

The present invention relates to a nonvolatile semiconductor storage apparatus such as a flash memory having a floating gate and a control gate to which positive and negative voltages are applied during a memory cell operation.

2. Description of the Related Art

FIG. 15 to FIG. 17 schematically show a conventional nonvolatile semiconductor storage apparatus of this type. FIG. 17 is a plan view showing the conventional nonvolatile semiconductor storage apparatus. FIG. 15 is a cross sectional view along the line A–A' in FIG. 17, and FIG. 16 is a cross sectional view along the line B–B' in FIG. 17. Explanation will be given on this conventional nonvolatile semiconductor storage apparatus with reference to these drawings.

In a P-type semiconductor substrate 1, there is formed an N-type well 2 to oppose to the P-type semiconductor substrate 1. In the N-type well 2, there is formed a P-type well 3 to oppose to the N-type well 2.

In a P-type semiconductor substrate 1, there is formed an N-type well 2 to oppose to the P-type semiconductor substrate 1. In the N-type well 2, there is formed a P-type well 3 to oppose to the N-type well 2. The P-type well 3 has a main surface on which a composite gate 8 is formed. The composite gate 8 consists of a first gate insulation film 4, a floating gate 5, a second gate insulation film 6, and a control gate 7 which are successively layered. On a surface of the P-type well 3 adjacent to the composite gate 8, a source 10 and a drain 11 are formed by an $N^+$-diffused layer. Moreover, over a part of the P-type well 3, there are formed a first inter-layer insulation film 12 and a contact 13, over which a first metal wiring 14, a second inter-layer insulation film 15, a second metal wiring 16, and a cover film 17 are formed.

Moreover, it is known that by connecting the control gate 7 to a diode through a wiring layer, it is possible to prevent a charge-up during an etching. However, in this type of nonvolatile semiconductor storage apparatus, both positive and negative voltages are applied to the control gate 7 during a memory cell operation. Accordingly, it is impossible to connect the control gate 7 to a charge-up preventing diode. Consequently, a charge-up is inevitable for a memory cell having the floating gate 5.

The conventional technology has a problem that a charge-up during wiring layer etching causes a memory cell floating gate to trap an electron or hole, causing characteristic fluctuation and an insulation film reliability lowering or insulation destruction. This is because both positive and negative voltages are applied to the control gate during a memory cell operation and the control gate cannot be connected to a charge-up preventing diode. That is, if a charge-up preventing diode is connected to the control gate, the charge-up preventing diode is biased in a forward direction by either positive or negative voltage applied and accordingly, it becomes impossible to apply a desired voltage to the control gate.

SUMMARY OF THE INVENTION

It is therefore an object of the present invention to provide a nonvolatile semiconductor storage apparatus having a floating gate and a control gate to which both positive and negative voltages are applied during a memory cell operation, which apparatus enables to prevent characteristic fluctuation and insulation film reliability lowering or insulation destruction due to charge-up during a wiring layer etching.

The nonvolatile semiconductor storage apparatus according to the invention is an improved nonvolatile semiconductor storage apparatus having a floating gate and a control gate on a semiconductor substrate. The nonvolatile semiconductor storage apparatus according to an embodiment of the present invention is characterized in that a first well of a second conductive type opposite to the first conductive type of the semiconductor substrate is formed on the semiconductor substrate, and in the first well is formed a semiconductor layer of the first conductive type, which semiconductor layer is electrically connected to the control gate.

The nonvolatile semiconductor storage apparatus according to a further embodiment of the present invention is characterized in that on the semiconductor substrate of a first conductive type is formed a first well of a second conductive type opposite to the first conductive type of the semiconductor substrate, and in the first well is formed a second well of the first conductive type, in which is formed a semiconductor layer of the second conductive type, which semiconductor layer is electrically connected to the control gate. That is, a first well of an opposite conductive type to the semiconductor substrate is formed on the semiconductor substrate. A second well of an opposite conductive type to the first well is formed in the first well, and a semiconductor layer of an opposite conductive type to the second well is formed in the second well. This semiconductor layer is connected to the memory cell control gate so as to realize a charge-up preventing element.

The nonvolatile semiconductor storage apparatus production method according to the present invention is an improved production method for producing a nonvolatile semiconductor storage apparatus having a floating gate and a control gate on a semiconductor substrate. The production method according to an embodiment is characterized by steps of: forming on the semiconductor substrate of a first conductive type, a semiconductor layer of a second conductive type opposite to the first conductive type; electrically connecting the semiconductor layer to the control gate, and electrically insulating the semiconductor layer from the control gate during or after a wiring layer etching.

The nonvolatile semiconductor storage apparatus production method according to a further embodiment is characterized by steps of: forming on the semiconductor substrate of a first conductive type, a semiconductor layer of a second conductive type opposite to the first conductive type; electrically connecting the semiconductor layer to the control gate using a wiring, and cutting off the wiring connecting the semiconductor layer to the control gate during or after a wiring layer etching. In other words, the memory cell control gate is connected to the charge-up preventing diode and during a final wiring layer etching, the control gate is cut off from the charge-up preventing diode.

According to the present invention, the charge-up preventing element for preventing charge-up during a wiring layer etching assures an electric flow path, enabling to prevent a charge-up which may cause a memory cell characteristic fluctuation and an insulation film reliability lowering or insulation destruction as well as to enable to apply both of positive and negative voltages during a cell operation.

More specifically, an N-type well is formed on a P-type substrate. In the N-type well is formed a P-type well. In the P-type well, a N⁺ diffusion layer is formed. This N⁺ diffusion layer is connected to the control gate, whereas the P-type substrate and the N-type well are grounded. When a charge-up during a wiring layer etching has caused a positive voltage applied to the aforementioned N⁺ diffusion layer, the direction from the P-type well to the N-type well is a forward direction, and because the N-type well is grounded, it is possible to realize a diode having the N⁺ diffusion layer in the P-type well, assuring a current flow path. Moreover, when a charge-up during a wiring layer etching has caused a negative voltage applied to the aforementioned N⁺ diffusion layer, a direction from the N⁺ diffusion layer to the P-type well is a forward bias, thus enabling to realize a diode having the P-type well in the N-type well, assuring a current flow path.

Moreover, in a case when the charge-up preventing diode is connected to the control gate and during etching of a final wiring layer or the like, the control gate is cut off from the charge-up preventing diode, it is possible to assure a current flow path with the charge-up preventing diode and disconnection of the charge-up preventing diode by etching such as a final wiring layer etching enables to apply both of positive and negative voltages during a memory cell operation.

DESCRIPTION OF THE PREFERRED EMBODIMENTS

Description will now be directed to embodiments of the present invention with reference to the attached drawings.

Figure 1:
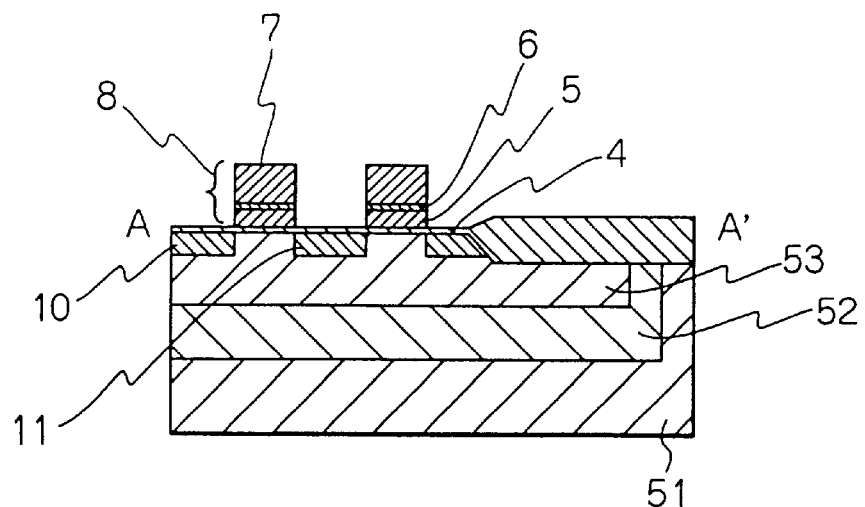
FIG. 1 is a cross sectional view along a line A–A' in FIG. 3 showing a nonvolatile semiconductor storage apparatus according to a first embodiment of the present invention.
Figure 2:
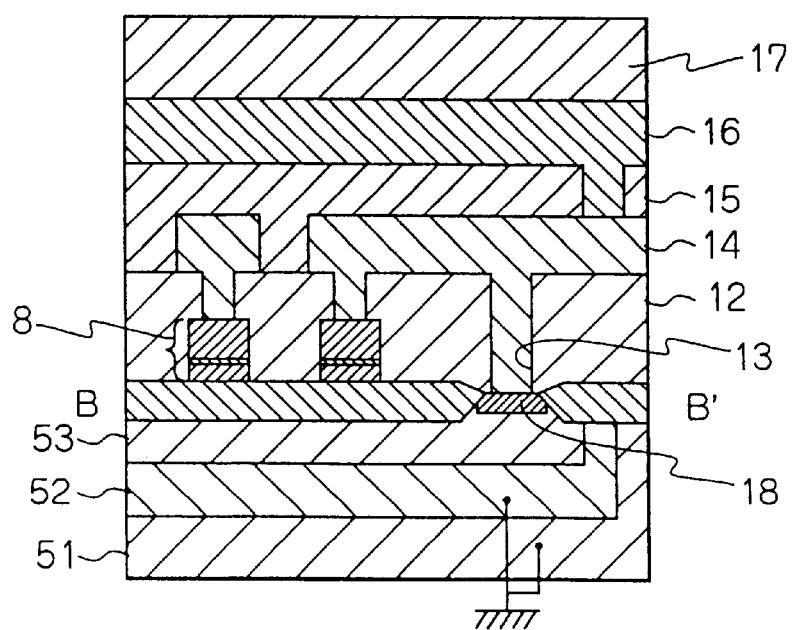
FIG. 2 is a cross sectional view along a line B–B' in FIG. 3 showing the nonvolatile semiconductor storage apparatus according to the first embodiment of the present invention.
Figure 3:
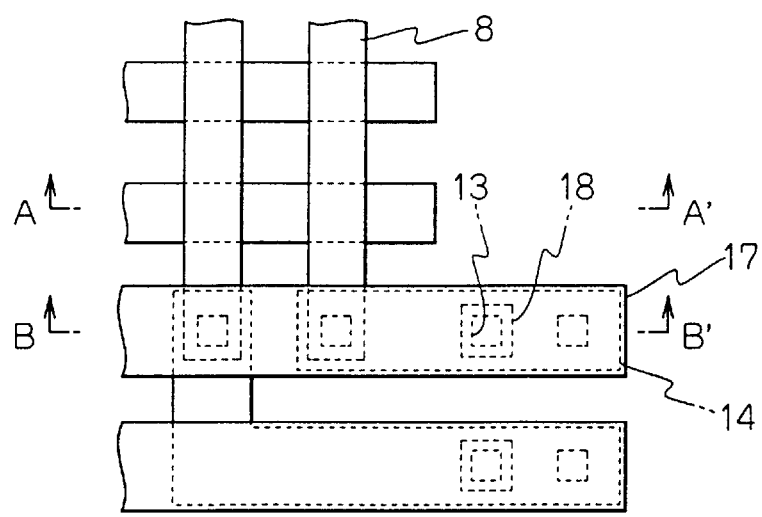
FIG. 3 is a plan view showing the nonvolatile semiconductor storage apparatus according to the first embodiment of the present invention.

FIG. 1 to FIG. 3 schematically show a nonvolatile semiconductor storage apparatus according to a first embodiment of the present invention. FIG. 1 is a cross sectional view along a line A–A' in FIG. 3, and FIG. 2 is a cross sectional view along a line B–B' in FIG. 3. FIG. 3 is a plan view showing the nonvolatile semiconductor storage apparatus according to the first embodiment. Hereinafter, an explanation will be given with reference to these drawings.

On a semiconductor substrate 51 of a first conductive type, a first well 52 of second conductive type which is opposite to the first conductive type is formed. In the first well 52, a second well 53 of the first conductive type is formed. On a main surface of the second well 53, a composite gate 8 is formed by a first gate insulation film 4, a floating gate 5, a second gate insulation film 6, and a control gate 7 which are successively layered. On the surface of the second well 53 adjacent to the composite gate 8 and in a portion to become a charge-up preventing element diffusion layer, a source 10, a drain 11, and a charge-up preventing element diffusion layer 18 of the second conductive type are formed by ion implantation. These are partially covered by a first inter-layer insulation film 12 and a contact 13, on which are further formed successively a first metal wiring 14, a second inter-layer insulation film 15, a second metal wiring 16, and a cover film 17, thus constituting a nonvolatile semiconductor storage apparatus.

Moreover, the control gate 7 is connected to the charge-up preventing element diffusion layer 18 by the first metal wiring 14. The first metal wiring 14 is connected to the second metal wiring 16. The semiconductor substrate 51 and the first well 52 are grounded.

It should be noted that in this embodiment, two metal wiring layers are provided, but it is also possible to provide a single or three or more metal wiring layers.

Figure 4:
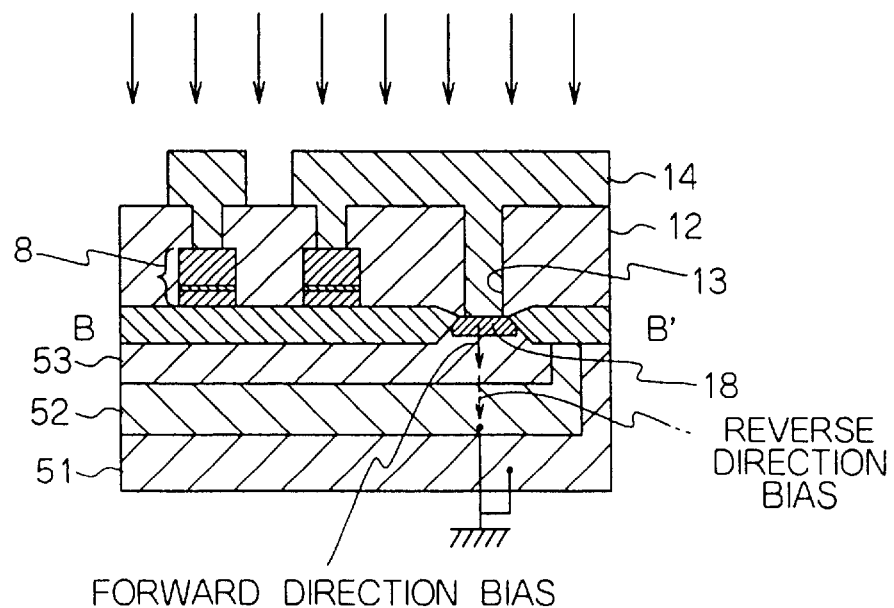
FIG. 4 is a cross sectional view along a line B–B' in FIG. 6 showing a wiring layer etching in the first embodiment.
Figure 5:
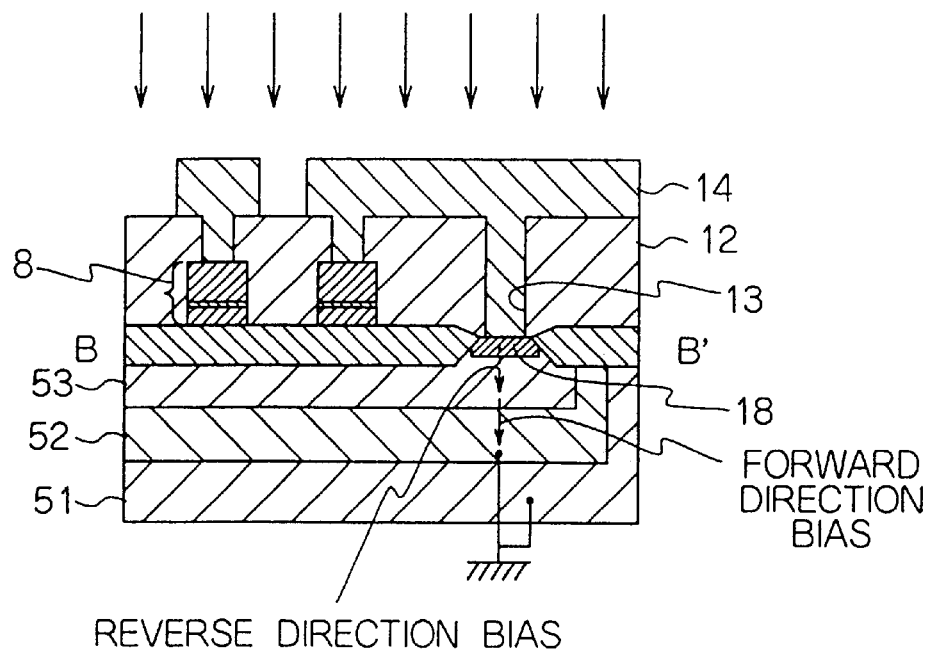
FIG. 5 is a cross sectional view along a line B–B' in FIG. 6 showing the wiring layer etching in the first embodiment.
Figure 6:
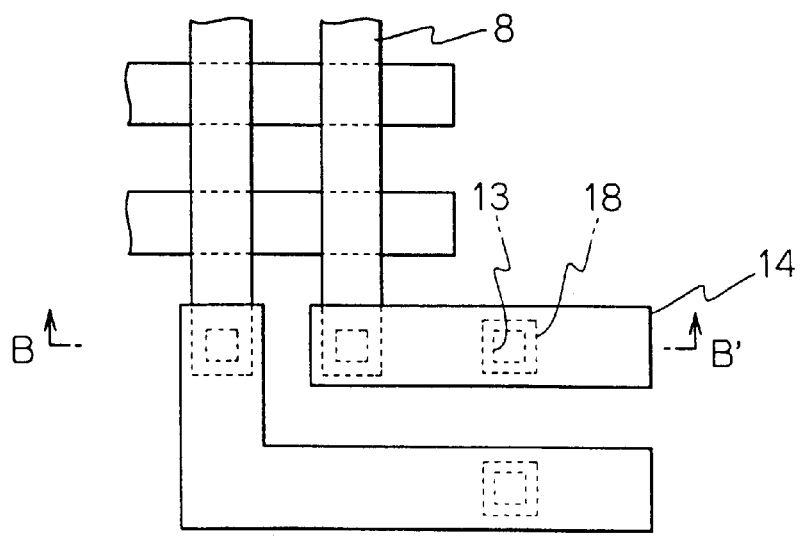
FIG. 6 is a plan view showing wiring layer etching in the first embodiment.

FIG. 4 to FIG. 6 schematically shows a wiring layer etching process according to this embodiment. FIG. 4 is a cross sectional view along a line B–B' in FIG. 6, and FIG. 5 is also a cross sectional view along a line B–B' in FIG. 6. FIG. 6 is a plan view. Hereinafter, explanation will be given on the function of the present embodiment with reference to these embodiments.

The semiconductor substrate 51 and the second well 53 are of the first conductive type, whereas the first well 52 and the charge-up preventing element diffusion layer 18 are of the second conductive type. The semiconductor substrate 51 and the first well 52 are grounded. Accordingly, when a forward direction voltage is applied from the diffusion layer 18 to the second well 53 at a charge-up during the wiring layer etching, the second well 53 and the first well 52 function as a charge-up preventing diode (FIG. 4). Moreover, when a reverse direction voltage is caused by charge-up from the diffusion layer 18 to the second well 53, a forward direction current flows from the second well 53 to the first well 52 and accordingly, the diffusion layer 18 and the second well 53 function as a charge-up preventing diode (FIG. 5).

Figure 7:
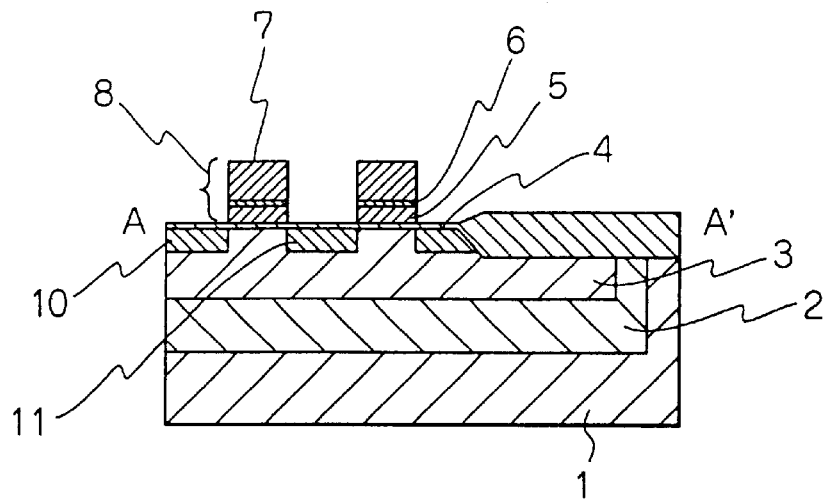
FIG. 7 is a cross sectional view along a line A–A' in FIG. 9 showing a specific example of the first embodiment.
Figure 8:
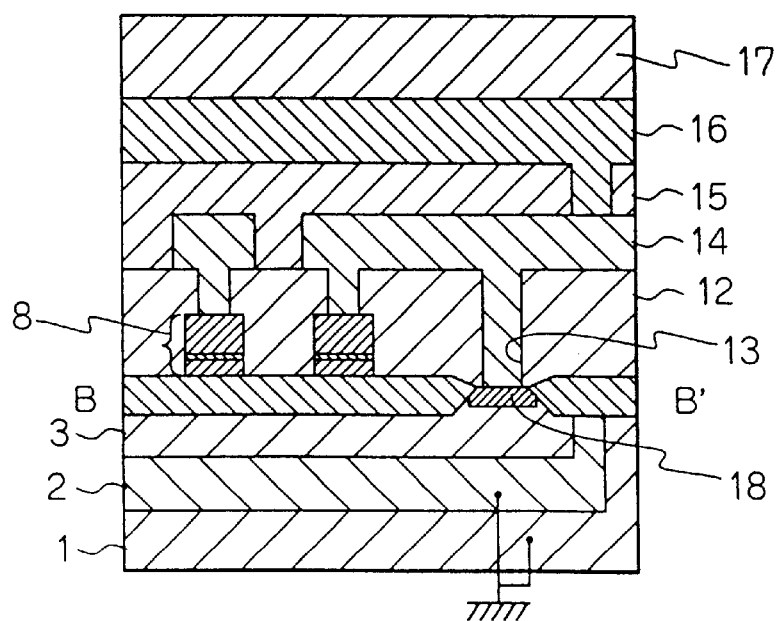
FIG. 8 is a cross sectional view along a line B–B' in FIG. 9 showing the specific example of the first embodiment.
Figure 9:
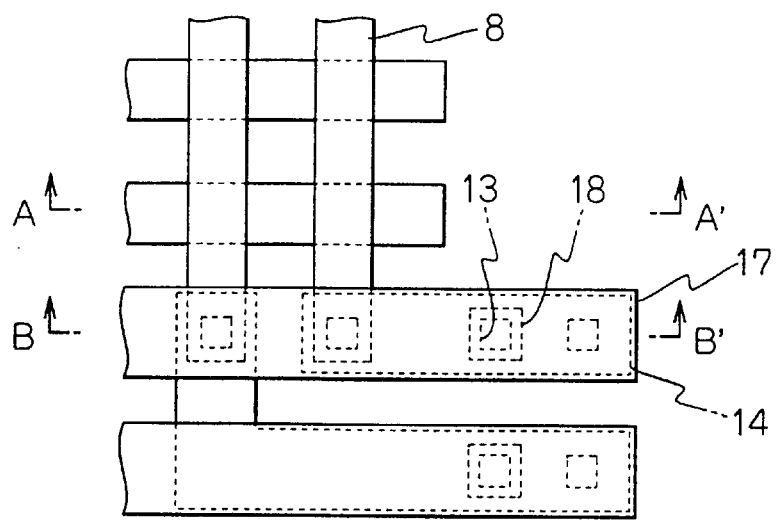
FIG. 9 is a plan view showing the specific example of the first embodiment.

FIG. 7 to FIG. 9 schematically show a specific example of the present embodiment. FIG. 7 is a cross sectional view along a line A–A' in FIG. 9, and FIG. 8 is a cross sectional view along a line B–B' in FIG. 9. FIG. 9 is a plan view. Hereinafter, explanation will be given with reference to these drawings.

In a P-type semiconductor substrate 1, an N-type well 2 of the opposite conductive type to the P-type semiconductor substrate 1 is formed. In the N-type well, a P-type well 3 is formed to oppose to the N-type conductivity. On a main surface of the P-type well 3 is formed a composite gate 8 consisting of: a first gate insulation film 4 having a thickness in the order of 100 Angstrom, a floating gate 5 having a thickness in the order of 1000 Angstrom, a second gate insulation film 6 having a thickness of 150 Angstrom, and a control gate 7 having a thickness in the order of 2000 Angstrom which are successively layered. On the surface of the P-type well 3 adjacent to the composite gate 8 and in a portion to become a charge-up preventing element diffusion layer, a source 10, a drain 11, and a charge-up preventing element diffusion layer 18 are formed by way of ion implantation. These are partially covered by a first inter-layer insulation film 12 having a thickness in the order of 7000 Angstrom and a contact 13, on which are further formed successively a first metal wiring 14 having a thickness in the order of 5000 angstrom, a second inter-layer insulation film 15 having a thickness in the order of 6000 Angstrom, a second metal wiring 16 having a thickness in the order of 7000 Angstrom, and a cover film 17 having a thickness in the order of 9000 Angstrom, thus forming a flash memory.

Moreover, the control gate 7 is connected to the charge-up preventing element diffusion layer 18 by the first metal wiring 14. The first metal wiring 14 is connected to the second metal wiring 16. Moreover, the P-type semiconductor substrate 1 and the N-type well 2 are grounded.

Figure 10:
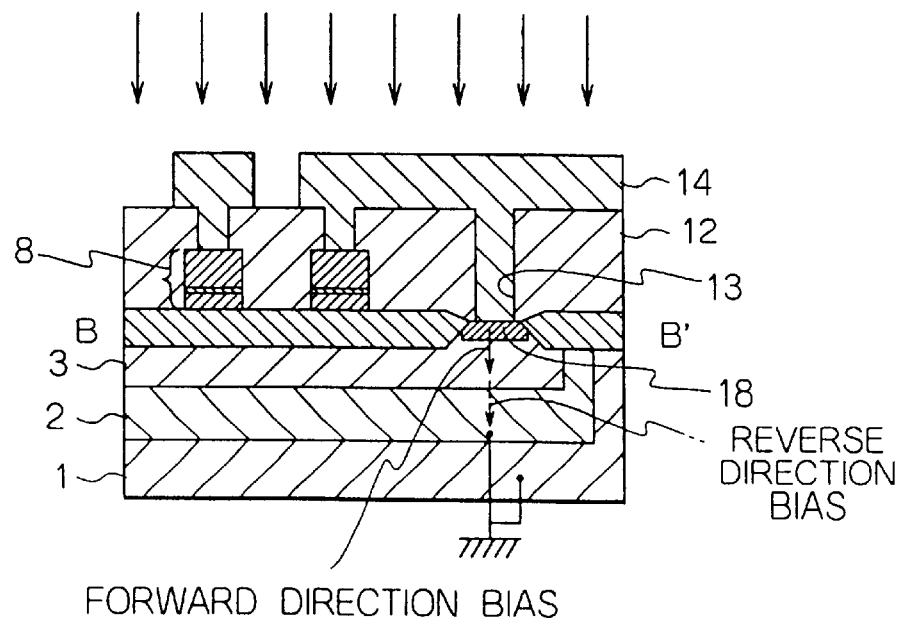
FIG. 10 is a cross sectional view along a line B–B' in FIG. 12 showing a wiring layer etching in a specific example.
Figure 11:
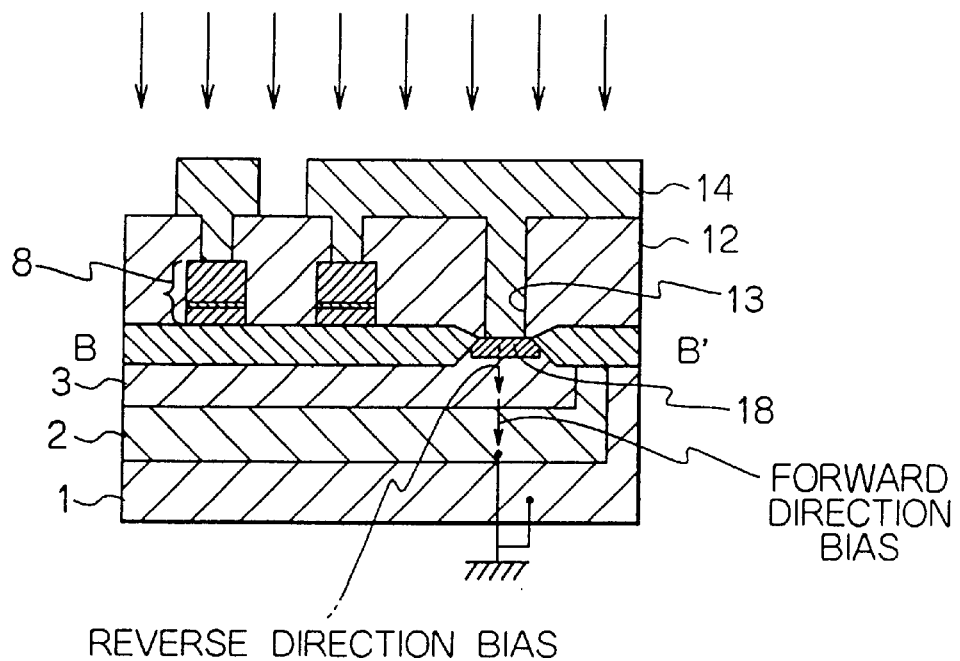
FIG. 11 is a cross sectional view along a line B–B' in FIG. 12 showing the wiring layer etching in the specific example.
Figure 12:
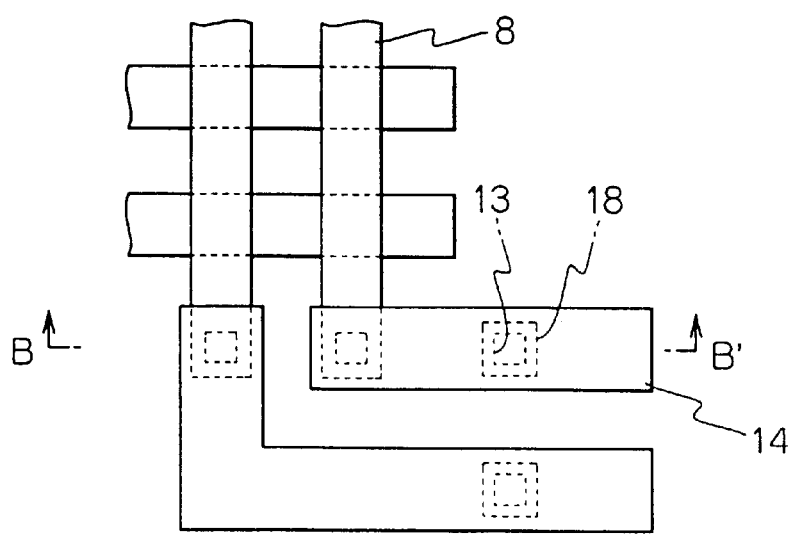
FIG. 12 is a plan view showing the wiring layer etching in the specific example.

FIG. 10 to FIG. 12 schematically show a wiring layer etching process in the present embodiment. FIG. 10 is a cross sectional view along a line B–B' in FIG. 12, and FIG. 11 is also a cross sectional view along a line B–B' in FIG. 12. FIG. 12 is a plan view. Hereinafter, explanation will be given on the function of the present embodiment with reference to these drawings.

The P-type semiconductor substrate 1 and the P-type well 3 are of an identical conductive type, whereas the N-type well 2 and the charge-up preventing element diffusion layer 18 are of another identical conductive type. The semiconductor substrate 1 and the N-type well 2 are grounded. Accordingly, when a forward direction voltage is applied from the diffusion layer 18 to the P-type well 3 at a charge-up during the wiring layer etching, the P-type well 3 and the N-type well 2 function as a charge-up preventing diode (FIG. 10). Moreover, when a reverse direction voltage is caused by the charge-up from the diffusion layer 18 to the P-type well 53, a forward direction current flows from the P-type well 3 to the N-type well 2 and accordingly, the diffusion layer 18 and the P-type well 3 function as a charge-up preventing diode (FIG. 11).

Figure 13:
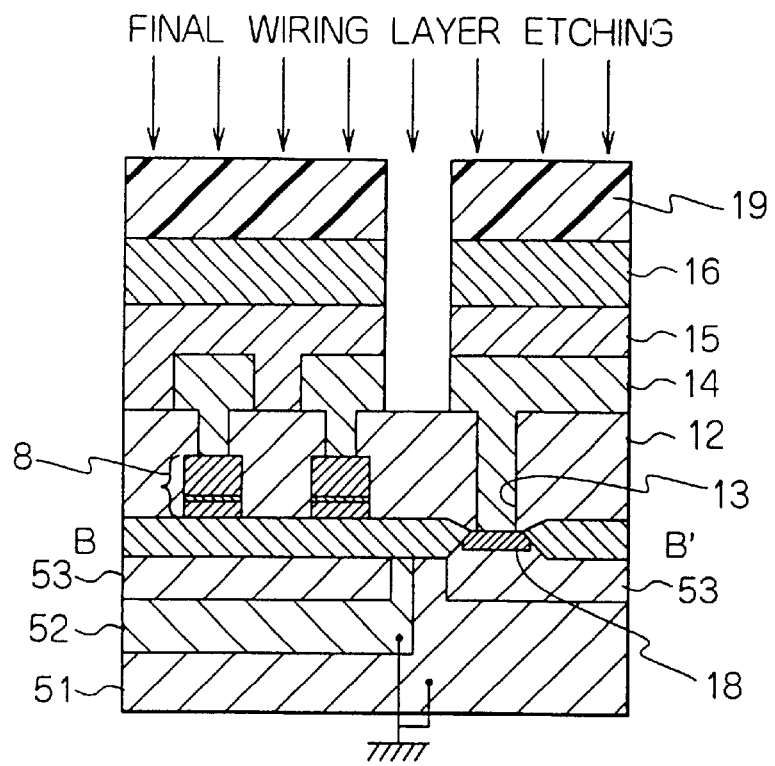
FIG. 13 is a cross sectional view along a line B–B' in FIG. 14 showing a nonvolatile semiconductor storage apparatus according to a second embodiment of the present invention.
Figure 14:
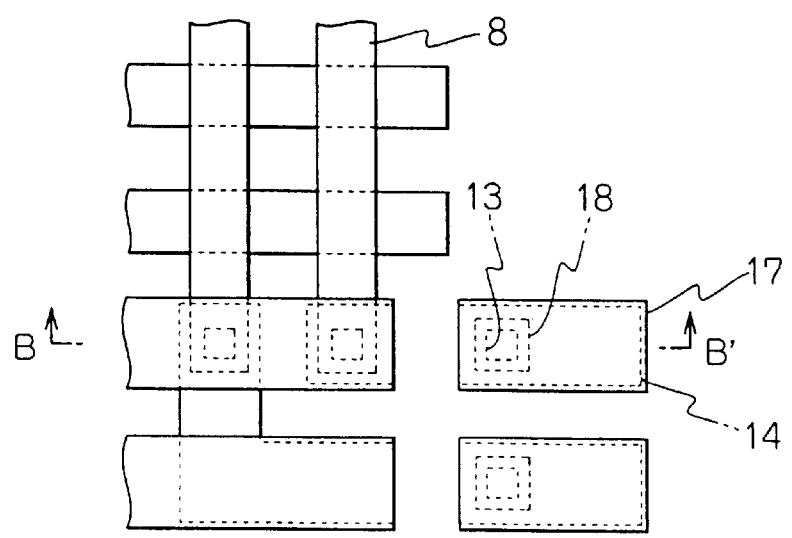
FIG. 14 is a plan view showing the nonvolatile semiconductor storage apparatus according to the second embodiment of the present invention.
Figure 15:
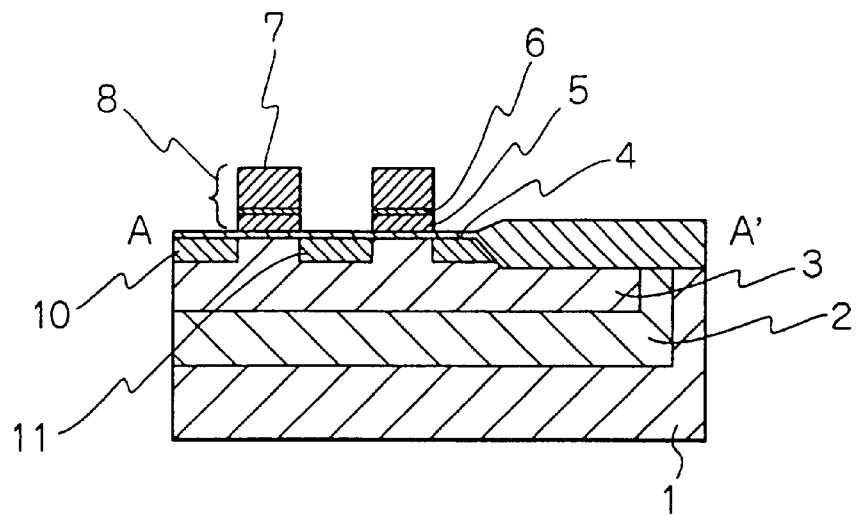
FIG. 15 is a cross sectional view along a line A–A' in FIG. 17 showing a conventional nonvolatile semiconductor storage apparatus.
Figure 16:
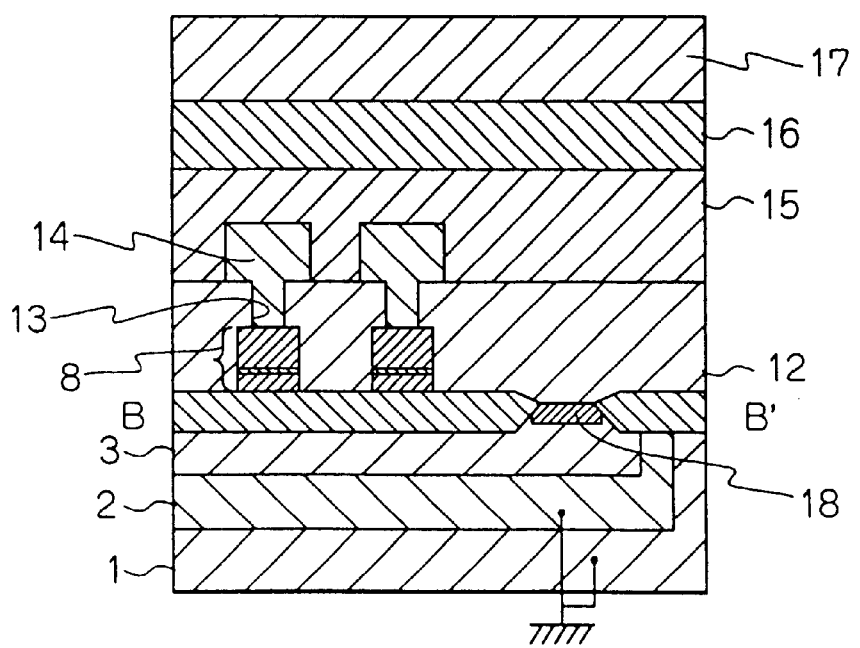
FIG. 16 is a cross sectional view along a line B–B' in FIG. 17 showing the conventional nonvolatile semiconductor storage apparatus.
Figure 17:
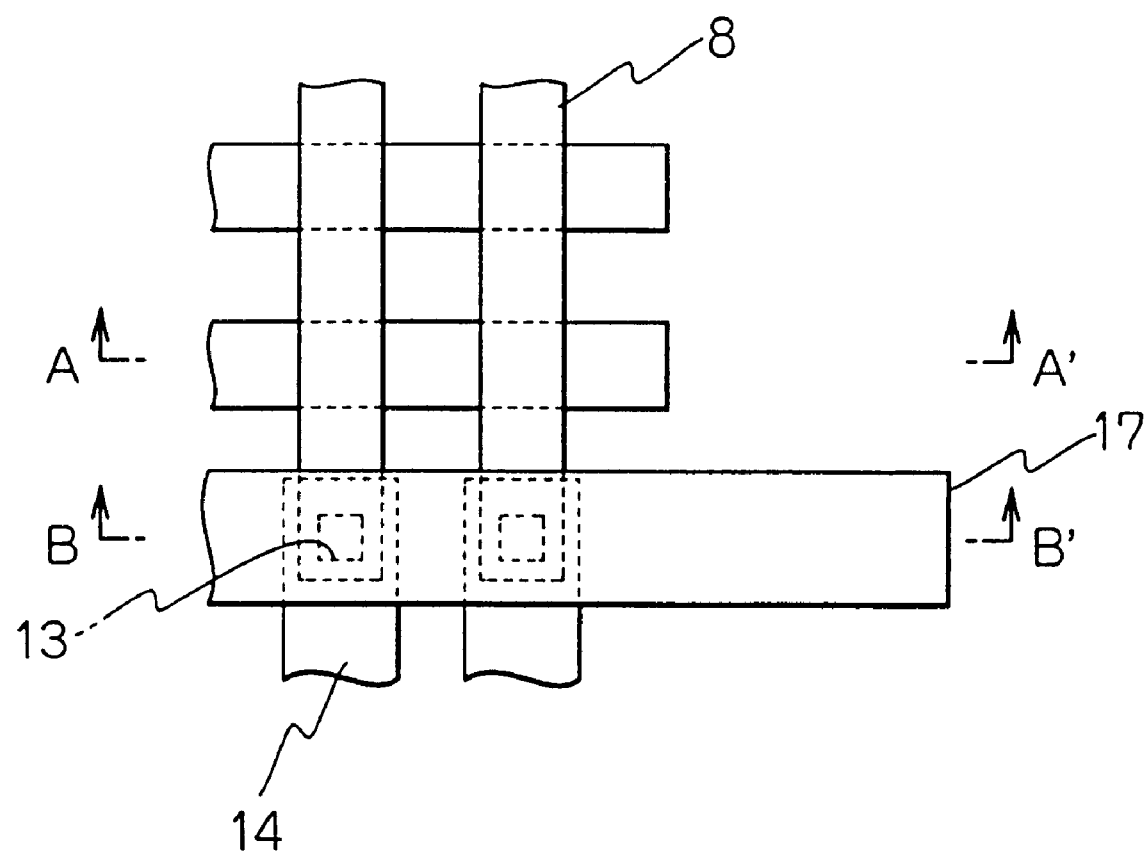
FIG. 17 is a plan view showing the conventional nonvolatile semiconductor storage apparatus.

FIG. 13 and FIG. 14 schematically show a nonvolatile semiconductor storage apparatus according to a second embodiment of the present invention. FIG. 13 is a cross sectional view along a line B–B' in FIG. 14. FIG. 14 is a plan view. Hereinafter, an explanation will be given with reference to these drawings. Like components as in the first embodiment (FIG. 1 to FIG. 3) are denoted by like symbols and their explanations will be omitted. Symbol 19 in FIG. 13 denotes resist.

In the second embodiment, in order to prevent the charge-up during a wiring layer etching, there is provided a charge-up preventing diode used when only positive or negative voltage is applied to the control gate 7 during a memory cell operation, and a current path is assured to prevent a charge-up. In the etching of the final wiring layer, the control gate 7 is cut off from the charge-up preventing diode in a memory cell. This enables application of both positive and negative voltages during a memory cell operation as well as to prevent charge-up during a wiring layer etching.

It should be noted that the aforementioned cut-off of the control gate 7 from the charge-up preventing diode in a memory cell may be carried out other than in the final wiring layer etching step such as in a cut-off dedicated etching process.

In a nonvolatile semiconductor storage apparatus such as a flash memory having a control gate to which both of positive and negative voltages are applied, the present invention enables a prevention of trapping of electron or hole in a memory cell floating gate due to charge-up during a wiring layer etching. This enables a prevention of memory cell characteristic fluctuation and insulation film reliability lowering or insulation destruction.

This merit of the present invention is realized as follows. A charge-up preventing element is provided so that no operation trouble is caused even if both positive and negative voltages are applied to the memory cell control gate. This charge-up preventing element is connected to the control gate or a charge-up preventing diode is connected to the control gate through a wiring layer, which are later cut-off from each other during an etching such as in the final wiring layer etching. Thus, it is possible to prevent a charge-up to the memory cell during a wiring layer etching, and to apply both of positive and negative voltages during a memory cell operation.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 9-255697 (Filed on Sep. 19$^{th}$, 1997) including specification, claims, drawings and summary are incorporated herein by reference in its entirety.

What is claimed is:

1. A method for producing a nonvolatile semiconductor storage apparatus having a floating gate and a control gate on a semiconductor substrate, said method comprising steps of:
   providing said floating gate and said control gate on said semiconductor substrate;
   forming on said semiconductor substrate of a first conductive type, a diffusion layer of a second conductive type opposite to the first conductive type,
   electrically connecting said diffusion layer to said control gate, and
   electrically insulating said diffusion layer from said control gate during a wiring layer etching.

2. A method as claimed in claim 1, wherein said nonvolatile semiconductor storage apparatus is a flash memory.

3. A method as claimed in claim 1, further comprising another wiring layer etching, prior to electrically insulating said diffusion layer from said control gate during a wiring layer etching.

4. A method as claimed in claim 1, further comprising steps of:

forming a first well of the second conductive type on said semiconductor substrate; and forming a second well of the first conductive type on said first well, wherein said diffusion layer is formed on said second well.

5. A method for producing a nonvolatile semiconductor storage apparatus having a floating gate and a control gate on a semiconductor substrate, said method comprising steps of:

providing said floating gate and said control gate on said semiconductor substrate;

forming on said semiconductor substrate of a first conductive type, a diffusion layer of a second conductive type opposite to the first conductive type, electrically connecting said diffusion layer to said control gate, and electrically insulating said diffusion layer from said control gate after a wiring layer etching.

6. A method as claimed in claim 5, wherein said nonvolatile semiconductor storage apparatus is a flash memory.

7. A method as claimed in claim 5, further comprising steps of:

forming a first well of the second conductive type on said semiconductor substrate; and forming a second well of the first conductive type on said first well, wherein said diffusion layer is formed on said second well.

8. A method for producing a nonvolatile semiconductor storage apparatus having a floating gate and a control gate on a semiconductor substrate, said method comprising steps of:

providing said floating gate and said control gate on said semiconductor substrate;

forming on said semiconductor substrate of a first conductive type, a diffusion layer of a second conductive type opposite to the first conductive type, electrically connecting said diffusion layer to said control gate using a wiring, and cutting off said wiring connecting said diffusion layer to said control gate during a wiring layer etching.

9. A method as claimed in claim 8, wherein said nonvolatile semiconductor storage apparatus is a flash memory.

10. A method as claimed in claim 8, further comprising another wiring layer etching, prior to cutting off said wiring connecting said diffusion layer to said control gate during a wiring layer etching.

11. A method as claimed in claim 8, further comprising steps of:

forming a first well of the second conductive type on said semiconductor substrate; and forming a second well of the first conductive type on said first well, wherein said diffusion layer is formed on said second well.

12. A method for producing a nonvolatile semiconductor storage apparatus having a floating gate and a control gate on a semiconductor substrate, said method comprising steps of:

providing said floating gate and said control gate on said semiconductor substrate;

forming on said semiconductor substrate of a first conductive type, a diffusion layer of a second conductive type opposite to the first conductive type, electrically connecting said diffusion layer to said control gate using a wiring, and cutting off said wiring connecting said diffusion layer to said control gate after a wiring layer etching.

13. A method as claimed in claim 12, wherein said nonvolatile semiconductor storage apparatus is a flash memory.

14. A method as claimed in claim 12, further comprising steps of:

forming a first well of the second conductive type on said semiconductor substrate; and forming a second well of the first conductive type on said first well, wherein said diffusion layer is formed on said second well.

* * * * *